(12) United States Patent
Seacrist

(10) Patent No.: US 9,029,854 B2
(45) Date of Patent: May 12, 2015

(54) BULK SILICON WAFER PRODUCT USEFUL IN THE MANUFACTURE OF THREE DIMENSIONAL MULTIGATE MOSFETS

(75) Inventor: Michael R. Seacrist, Lake Saint Louis, MO (US)

(73) Assignee: SunEdison Semiconductor Limited (UEN201334164H), Singapore (SG)

(*) Notice: Subject to any disclaimer, the term of this patent is extended or adjusted under 35 U.S.C. 154(b) by 864 days.

(21) Appl. No.: 13/061,386

(22) PCT Filed: Aug. 20, 2009

(86) PCT No.: PCT/US2009/054495
§ 371 (c)(1),
(2), (4) Date: Feb. 28, 2011

(87) PCT Pub. No.: WO2010/025083
PCT Pub. Date: Mar. 4, 2010

(65) Prior Publication Data
US 2011/0163313 A1    Jul. 7, 2011

Related U.S. Application Data

(60) Provisional application No. 61/092,659, filed on Aug. 28, 2008.

(51) Int. Cl.
*H01L 23/58* (2006.01)
*H01L 21/66* (2006.01)
*H01L 21/3065* (2006.01)
*H01L 29/66* (2006.01)
*H01L 21/02* (2006.01)

(52) U.S. Cl.
CPC .......... *H01L 22/26* (2013.01); *H01L 21/02532* (2013.01); *H01L 21/02573* (2013.01); *H01L 21/0262* (2013.01); *H01L 21/3065* (2013.01); *H01L 29/66795* (2013.01)

(58) Field of Classification Search
CPC ....... H01L 22/12; H01L 22/34; H01L 29/165; H01L 29/7848
USPC ............................................ 257/48, 288, 289
See application file for complete search history.

(56) References Cited

U.S. PATENT DOCUMENTS

| 4,717,446 A | * | 1/1988 | Nagy et al. ................. 438/14 |
| 6,331,467 B1 | * | 12/2001 | Brown et al. .............. 438/270 |
| 6,515,348 B2 | | 2/2003 | Hueting et al. |

(Continued)

FOREIGN PATENT DOCUMENTS

| JP | 55085674 A | 6/1980 |
| WO | 2005065385 A2 | 7/2005 |

OTHER PUBLICATIONS

International Search Report, PCT/US2009/054495, dated Oct. 15, 2009, 2 pages.

(Continued)

*Primary Examiner* — Matthew E Warren
(74) *Attorney, Agent, or Firm* — Armstrong Teasdale LLP

(57) ABSTRACT

A method for preparing a semiconductor structure for use in the manufacture of three dimensional transistors, the structure comprising a silicon substrate and an epitaxial layer, the epitaxial layer comprising an endpoint detection epitaxial region comprising an endpoint detection impurity selected from the group consisting of carbon, germanium, or a combination.

8 Claims, 4 Drawing Sheets

(56) References Cited

U.S. PATENT DOCUMENTS

| | | |
|---|---|---|
| 6,642,090 B1 | 11/2003 | Fried et al. |
| 7,115,955 B2 * | 10/2006 | Messenger et al. ........... 257/369 |
| 7,145,220 B2 | 12/2006 | Morikado |
| 7,394,117 B2 | 7/2008 | Jung et al. |
| 7,608,890 B2 | 10/2009 | Yagishita |
| 2006/0170066 A1 * | 8/2006 | Mathew et al. ............... 257/401 |
| 2007/0018237 A1 | 1/2007 | Kim et al. |
| 2007/0023756 A1 | 2/2007 | Anderson et al. |
| 2008/0171408 A1 | 7/2008 | Zhu et al. |
| 2009/0321849 A1 | 12/2009 | Miyamura et al. |

OTHER PUBLICATIONS

Written Opinion, PCT/US2009/054495, dated Oct. 15, 2009, 12 pages.

Extended Search Report issued for EP Application No. 09810475.5, dated Mar. 26, 2013 (8 pages).

* cited by examiner

BULK SILICON WAFER PRODUCT USEFUL IN THE MANUFACTURE OF THREE DIMENSIONAL MULTIGATE MOSFETS

REFERENCE TO RELATED APPLICATIONS

This application is the U.S. national stage application of International Patent Application No. PCT/US2009/054495, filed Aug. 20, 2009 and claims the benefit of U.S. Application No. 61/092,659, filed Aug. 28, 2008, the entire disclosures of which are incorporated herein by reference.

FIELD OF THE INVENTION

The present invention relates to a method for producing a silicon wafer useful in the manufacture of three dimensional transistors.

BACKGROUND OF THE INVENTION

Three dimensional metal-oxide-semiconductor field-effect transistors ("MOSFETs"), often referred to as MultiGate FET ("MUGFETs"), "finFETs," or "TriGate FETs," are expected to be adopted in complementary metal-oxide-semiconductor ("CMOS") device fabrication at the 32 nm technology node in order to alleviate issues with short channel effects. Manufacture of a three dimensional MOSFET requires masked etching of silicon to create a raised cuboid of silicon referred to in the art as a "fin" that serves as the body of the transistor. In the manufacture of the three dimensional transistor, control of the fin length, depth, and height are key process control factors. The typical height of the fin is between about 50 nm and about 100 nm. The means of controlling fin height depends upon the silicon wafer. The fin length and depth are controlled in device processing by photolithography and etching. After formation of the fin, the transistor gate, source, and drain are then formed around the silicon fin.

Silicon on insulator ("SOI") wafers have been the focus of research on the development of three dimensional transistors since the buried oxide layer in a SOI wafer is a natural etch stop during plasma etching of the fin due to etch rate selectivity between silicon and silicon dioxide. The SOI film thickness, therefore, determines the height of the film and the height uniformity. FIG. 1 depicts a three dimensional MOSFET 1 fabricated on an SOI wafer substrate 3 comprising an oxide layer 5. The silicon fin 7 is a raised, free standing rectangle of silicon that is contacted by source 9 and drain 11 on its ends, and has a gate dielectric and electrode surrounding it on three sides. The transistor gate length is determined by the gate dimension 13. The transistor gate width is determined by the height of the fin.

The SOI wafer, however, does not contribute to improved device performance of the three dimensional transistor. The SOI wafer may degrade thermal conductivity compared to polished bulk wafers or epitaxial wafers. Moreover, the use of SOI wafer is disadvantageous from a cost perspective compared to fabricating a three-dimensional transistor on a non-SOI bulk wafer. See H. Wong, "Beyond The Conventional Transistor, IBM J. Res. & Dev., VOL 46 NO 2/3 March/May 2002; B. Doyle et al., "Tri-Gate Fully Depleted CMOS Transistors: Fabrication, Design and Layout", VLSI Symposium 2003; and J. Kavalieros, et al, "Tri-Gate Transistor Architecture with High-k Gate Dielectrics, Metal Gates and Strain Engineering", VLSI Symposium 2006.

FIG. 2 is a cross section diagram of a three dimensional transistor 15 fabricated on a bulk silicon substrate 17 based on work reported in T. Park et al., "Fabrication of Body-Tied FinFETs Using Bulk Wafers," VLSI Symposium 2003 and K. Okano, et al., "Process Integration Technology and Device Characteristics of CMOS FinFET on Bulk Silicon Substrate with Sub-10 nm Fin Width and 20 nm Gate Length," IEDM 2005. Trenches between about 200 nm and about 300 nm deep are etched into the silicon, forming a fin 19 having a total fin height of between about 200 nm and about 300 nm. Then, a SiN layer 21 and a SiO$_2$ layer 23 are added to define the fin active height which is on the order of one-third to one-half the total fin height. The gate dielectric 25 and electrode surround it on three sides. The top portion of the fin is tailored to the desired length and depth. For the bulk wafer, the total fin height is determined by the etch process, while the active transistor fin height is determined by the total fin height minus the SiN layer and subsequent trimming of the top of the fin. Bulk wafers present a transistor processing challenge since they lack the built-in oxide etch stop available on the SOI wafer.

Therefore, manufacture of three dimensional transistors in bulk wafers may be improved by adding a layer near the surface that can provide endpoint detection during plasma etching of the fin, thereby determining the fin height. This may be achieved during device fabrication by ion implantation of an implantable species at a concentration capable of creating a change in etch rate or providing an endpoint detection. Ion implant enables precise depth control over the entire wafer surface area, and offers precise dose control and flexibility in the selection of the chemical species. A negative effect occurs, however, when the implant species travels through the device region and disorders the silicon lattice. Following ion implant, thermal annealing is required to activate the implant species into silicon lattice sites and to eliminate or reduce residual damage caused by the ion implant. Another potential disadvantage of ion implantation is the broad depth distribution of the ion implanted species, which may affect the ability of the subsequent etching process to define fins of precise heights.

U.S. Pat. No. 6,642,090 discloses two ion implant methods for fin height control in bulk substrates. In one method, ion implant damage evolves a differential etch rate between the damaged trench area and the undamaged fin. In another method, a marker layer is implanted using an impurity that can be detected during plasma etching.

SUMMARY OF THE INVENTION

Among the aspects of the present invention may be noted the provision of a method for preparing a silicon wafer suitable for use in the manufacture of three dimensional transistors. The silicon wafer comprises an endpoint detection region that is formed by epitaxial deposition, thereby avoiding the potentially damaging effects of ion implantation methods to form the endpoint detection layer.

Briefly, therefore, the present invention is directed to a semiconductor structure. The structure comprises (a) a silicon substrate having a central axis, a front surface and a back surface that are generally perpendicular to the central axis, a central plane between and parallel to the front and back surfaces, a circumferential edge, and a radius extending from the central axis to the circumferential edge and (b) an epitaxial layer having a front surface and a back surface, wherein the back surface of the epitaxial layer is contiguous with the front surface of the silicon substrate. The epitaxial layer comprises (1) a surface epitaxial region extending an average transverse distance, $D_1$, as measured from the front surface of the epitaxial layer toward the central plane; (2) an endpoint detection epitaxial region extending an average transverse distance, $D_2$, as measured from the surface epitaxial region toward the central plane; and (3) a bulk epitaxial region extending an average transverse distance, $D_3$, as measured from the endpoint detection epitaxial region toward the central plane. Moreover, the endpoint detection epitaxial region comprises an endpoint detection impurity selected from the group consisting of carbon, germanium, or a combination thereof present in the endpoint detection epitaxial region at a concentration that is at least 100 times a concentration of the endpoint detection impurity in the surface epitaxial region.

The invention is further directed to a method for preparing a semiconductor structure. The structure comprises (a) a silicon substrate having a central axis, a front surface and a back surface that are generally perpendicular to the central axis, a central plane between and parallel to the front and back surfaces, a circumferential edge, and a radius extending from the central axis to the circumferential edge and (b) an epitaxial layer having a front surface and a back surface, wherein the back surface of the epitaxial layer is contiguous with the front surface of the silicon substrate. The method comprises forming a bulk epitaxial region on the front surface of the silicon substrate; forming an endpoint detection epitaxial region on the bulk epitaxial region; and forming a surface epitaxial region on the endpoint detection epitaxial region. The endpoint detection epitaxial region comprises an endpoint detection impurity selected from the group consisting of carbon, germanium, or a combination thereof present in the endpoint detection epitaxial region at a concentration that is at least 100 times a concentration of the endpoint detection impurity in the surface epitaxial region.

The invention is still further directed to a method for preparing a semiconductor structure. The structure comprises (a) a silicon substrate having a central axis, a front surface and a back surface that are generally perpendicular to the central axis, a central plane between and parallel to the front and back surfaces, a circumferential edge, and a radius extending from the central axis to the circumferential edge and (b) an epitaxial layer having a front surface and a back surface, wherein the back surface of the epitaxial layer is contiguous with the front surface of the silicon substrate and the front surface comprises a fin. The method comprises forming the epitaxial layer on the front surface of the silicon substrate, the epitaxial layer comprising a surface epitaxial region extending from the front surface of the epitaxial layer toward the central plane and an endpoint detection epitaxial region extending from the surface epitaxial region toward the central plane; wherein the endpoint detection epitaxial region comprises an endpoint detection impurity selected from the group consisting of carbon, germanium, or a combination thereof present in the endpoint detection epitaxial region at a concentration that is at least 100 times a concentration of the endpoint detection impurity in the surface epitaxial region; etching the surface epitaxial region to form the fin in the front surface of the epitaxial layer; monitoring a chamber gas composition while the surface epitaxial region is etched; and terminating etching when the chamber gas composition demonstrates an increase in endpoint detection impurity concentration increase of at least about 20%.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE EMBODIMENT(S) OF THE INVENTION

Figure 1:
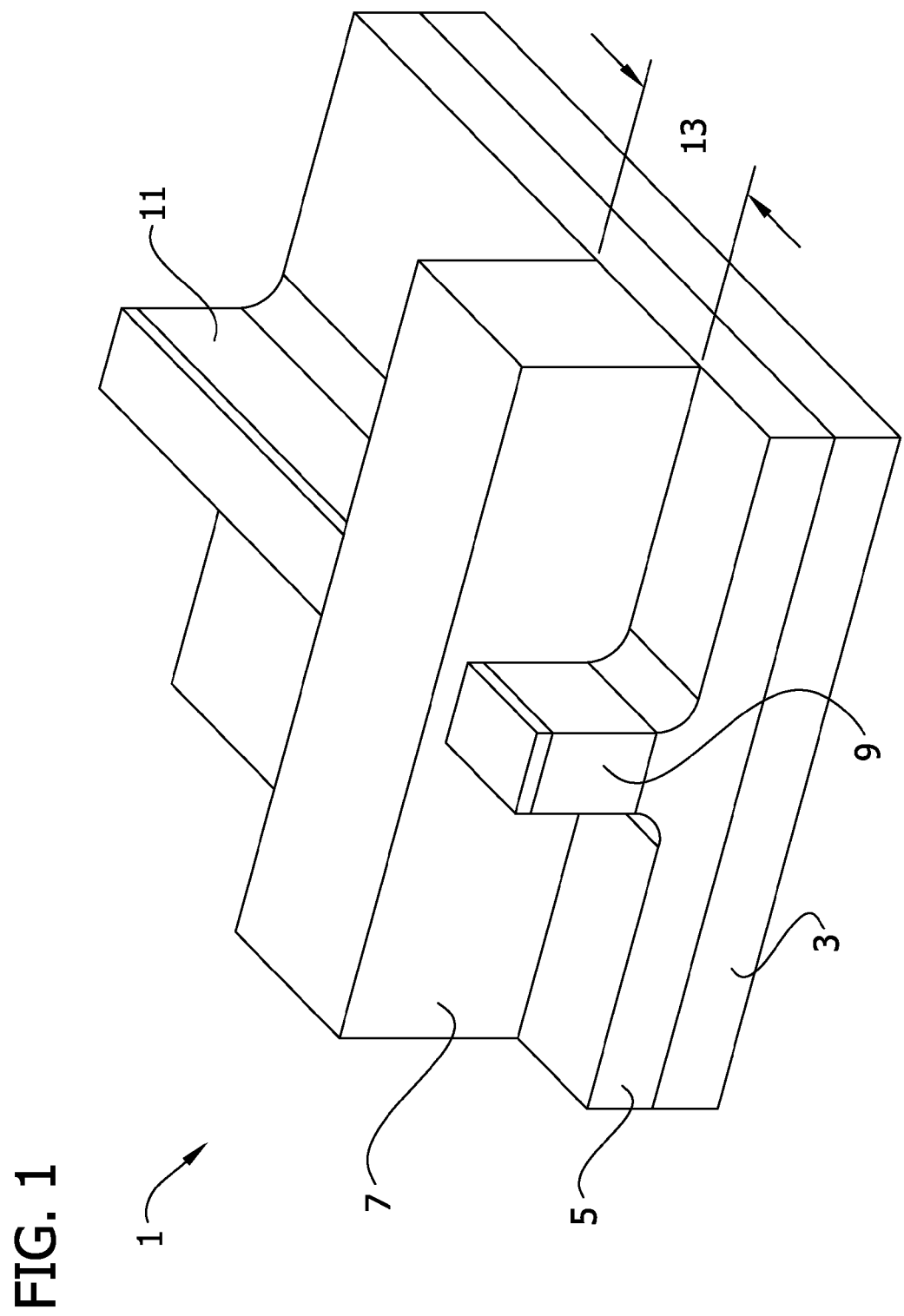
FIG. 1 is a depiction of a three dimensional MOSFET fabricated on an SOI wafer.
Figure 2:
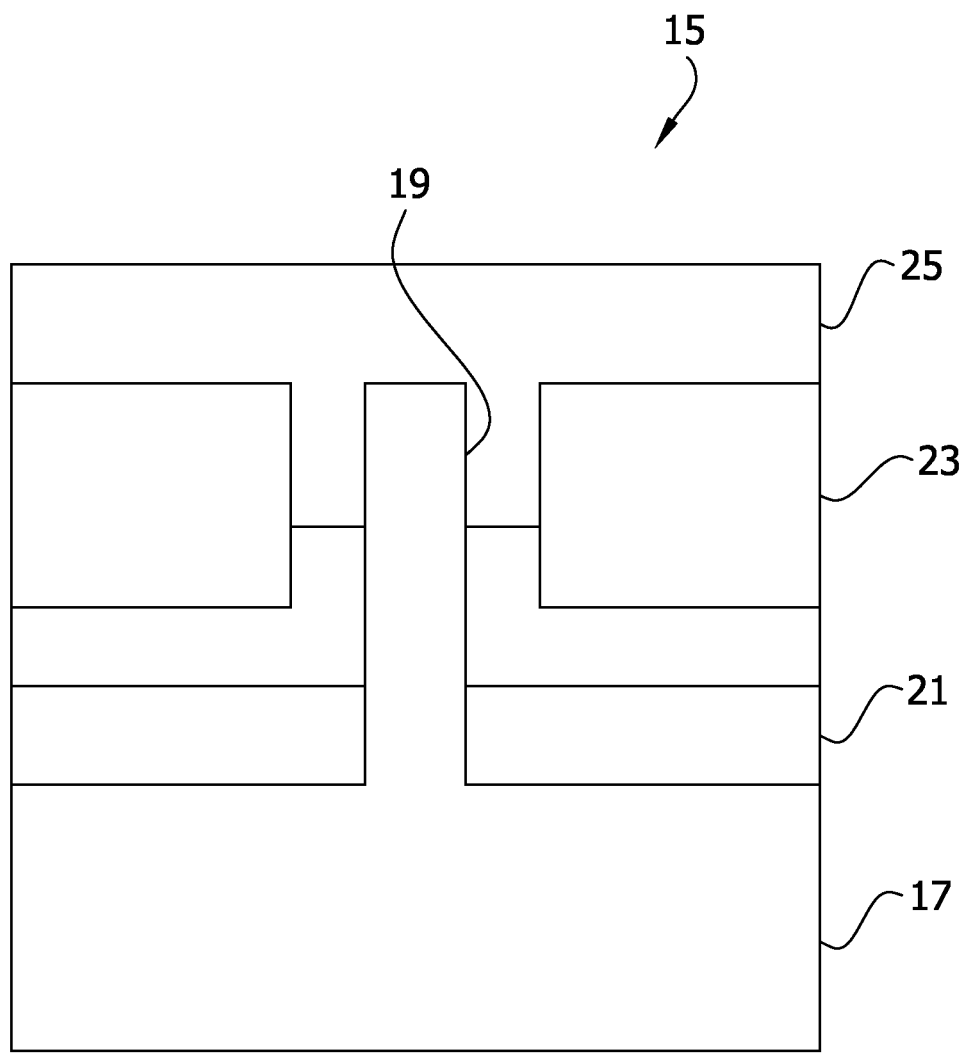
FIG. 2 is a cross section diagram of a three dimensional transistor fabricated on a bulk silicon substrate.

The present invention is directed to a method for preparing a semiconductor structure for the manufacture of three dimensional transistors. The semiconductor structure comprises a silicon wafer substrate and an epitaxial layer, the epitaxial layer comprising an endpoint detection region compatible with three dimensional transistor fabrication. Since the endpoint detection region is formed by epitaxial deposition, the fin height may be more precisely controlled. The semiconductor structure may be manufactured at a lower cost compared to the preparation of SOI wafers for use in manufacture of three dimensional transistors. Moreover, the semiconductor structure is not prepared by ion implantation methods that may potentially damage the silicon lattice structure. This further avoids the need for annealing the semiconductor structure post-implantation to repair the damage to the lattice structure and activate the implanted dopant atom.

In general, the semiconductor structure of the present invention is prepared for the manufacture of three dimensional transistors by epitaxial deposition. During deposition of an epitaxial deposition layer, deposition conditions, e.g., the composition of the gas, the reaction temperature, etc., are carefully tailored to form a thin region within the epitaxial layer that is doped with an endpoint detection impurity that marks the endpoint during a subsequent etching process that forms the fin(s) in the epitaxial region of the wafer. In this regard, the epitaxial deposition process of the present invention involves controlling epitaxial deposition conditions to form (1) a bulk epitaxial region on the front surface of the silicon wafer substrate, (2) an endpoint detection epitaxial region on the bulk epitaxial region, and (3) a surface epitaxial region on the endpoint detection epitaxial region.

In this method, the composition of the gas during the formation of the bulk epitaxial region and the surface epitaxial region may be any conventional composition for deposition an epitaxial layer, such as $SiH_4$, $SiCl_3H$, etc. These epitaxial regions may also be doped with p dopant (e.g., boron) or n dopant (e.g., As, P) as is conventionally known. The composition of the gas for the deposition of the endpoint detection epitaxial deposition region is varied in order to deposit an endpoint detection impurity in the endpoint detection epitaxial deposition region during its formation. Preferably, the endpoint detection impurity is not an electrically active dopant atom, such that the endpoint detection impurity does not affect the electrical properties of the device. Moreover, the endpoint detection impurity is preferably not deposited in the endpoint detection epitaxial deposition region at a concentration high enough to induce misfit dislocations. Additionally, the endpoint detection impurity is preferably consumed and removed easily during silicon oxidation after fin etching. Impurities meeting these constraints include germanium and carbon, with carbon being particularly preferred.

A. Silicon Substrate

In general, the silicon substrate upon which an epitaxial layer is deposited according to the method of the present invention may be a silicon wafer which has been sliced from a single crystal ingot grown in accordance with conventional Czochralski ("Cz") crystal growing methods, typically having a nominal diameter of 150 mm, 200 mm, 300 mm, 400 mm, or more. The silicon wafer may be sliced from a crystal having any lattice structure attainable by the Cz growth method, i.e., 100, 110, 111, etc. The wafer may be polished or, alternatively, lapped and etched but not polished. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications.

Figure 3:
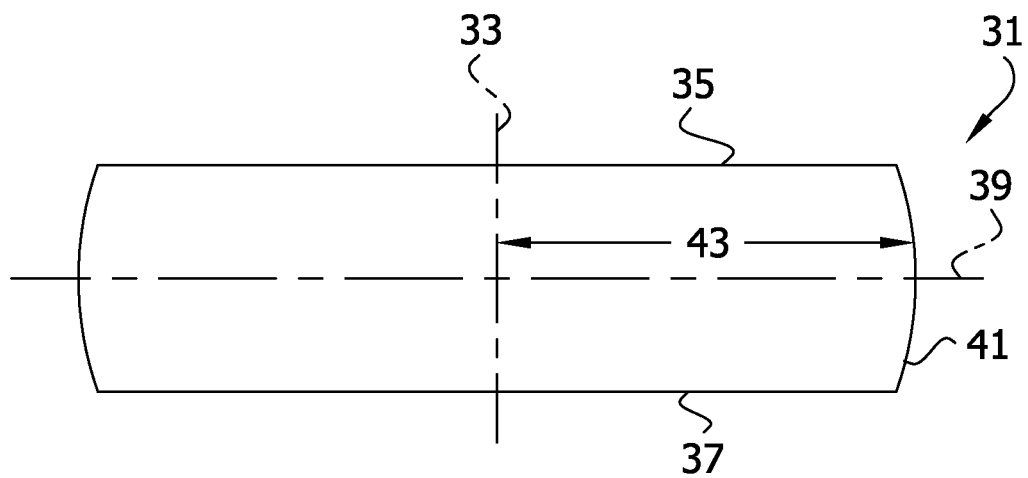
FIG. 3 is a schematic depiction of the process of the invention.
Figure 3:
Figure 3:
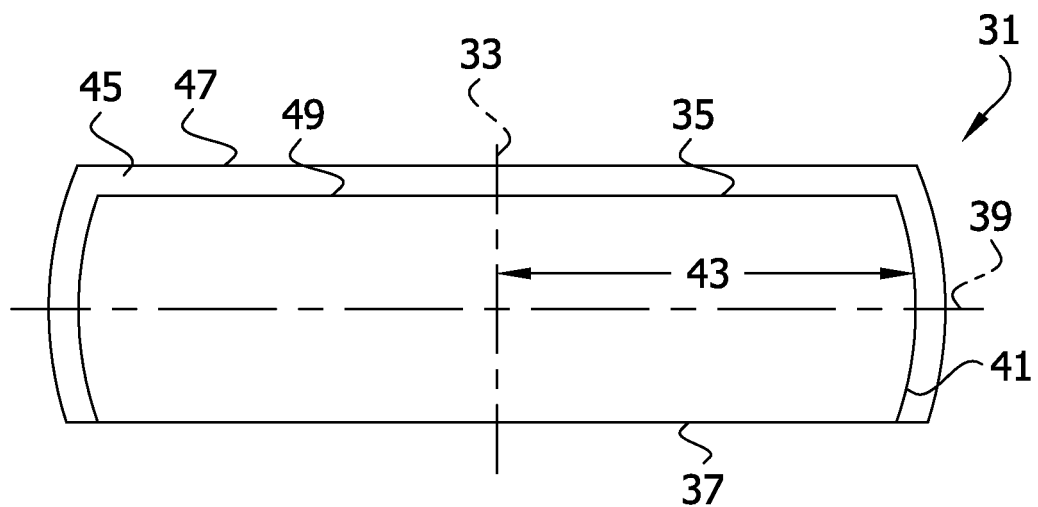

Referring to FIG. 3, the silicon substrate may be a silicon wafer 31 having a central axis 33, a front surface 35, a back surface 37, an imaginary central plane 39 between and parallel to the front and back surfaces, a circumferential edge 41, and a radius 43 extending from the central axis to the circumferential edge. The terms "front" and "back" in this context are used to distinguish the two major, generally planar surfaces of the wafer 31. The front surface 35 of the wafer 31 (as that phrase is used herein) is not necessarily the surface onto which an electronic device will subsequently be fabricated, nor is the back surface 37 of the wafer 31 (as that phrase is used herein) necessarily the major surface of the wafer 31 which is opposite the surface onto which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The single crystal silicon wafer may be doped with one or more N-type or P-type dopants. Typical N-type dopants include phosphorous, arsenic, and antimony. Typical P-type dopants include boron, aluminum, and gallium. In one preferred embodiment, the wafer substrate for use in the manufacture of three dimensional transistors is doped with p-type dopant, more preferably, the wafer is doped with boron. Dopant concentrations may vary between about $10^{-3}$ dopant atoms per cm$^3$ (about 0.0002 PPMA) to about $2\times10^{19}$ dopant atoms per cm$^3$ (about 200 PPMA), which corresponds to resistivities ranging from about 1000 ohm cm to about 0.005 ohm cm. In one preferred embodiment, the silicon substrate is heavily doped with boron at concentrations ranging from about $10^{18}$ dopant atoms per cm$^3$ (about 20 PPMA) to about $10^{19}$ dopant atoms per cm$^3$ (about 200 PPMA), which corresponds to resistivities ranging from about 0.04 ohm cm to about 0.009 ohm cm.

In general, Cz grown silicon substrates contain oxygen in a oxygen concentration falling anywhere within a range between about $10^{17}$ dopant atoms per cm$^3$ (about 2 PPMA) to about $10^{18}$ dopant atoms per cm$^3$ (about 20 PPMA). The Czochralski growth process may also result in substitutional carbon present in low concentrations as an impurity in single crystal silicon. Typically, single crystal silicon has less than about $5\times10^{16}$ atoms/cm$^3$, preferably less than about $1\times10^{16}$ atoms/cm$^3$, more preferably less than about $5\times10^{15}$ atoms/cm$^3$ carbon.

B. Epitaxial Layer

The semiconductor structure for use in the manufacture of three dimensional transistors comprises an epitaxial layer on a surface of the silicon substrate. With reference again to FIG. 3, the epitaxial layer 45 may be deposited onto the front surface 35 of the silicon substrate 31, the back surface 37 of the silicon substrate 31, or both the front and back surfaces of the silicon substrate. In one embodiment, the epitaxial layer 45 is deposited on one surface of the silicon substrate, preferably, the front surface 35 of the substrate, the front surface 35 of the silicon substrate 31 being the surface in which the three dimensional transistor will be fabricated during subsequent processing. The epitaxial layer 45 comprises a front surface 47 and a back surface 49. In this regard, the back surface 49 of the epitaxial layer is the surface of the epitaxial layer that is contiguous with the front surface 35 of the silicon wafer substrate 31.

The epitaxial layer 45 is generally deposited to a thickness (i.e., average transverse distance as measured from the front surface 47 of the epitaxial layer to the back surface 49 of the epitaxial layer) between about 1 micrometer and about 6 micrometers, which is thick enough for wafers used in the manufacture of advanced logic and memory devices, more generally between about 2 micrometers and about 4 micrometers, and more preferably between about 2 micrometers and about 3 micrometers.

Figure 4:
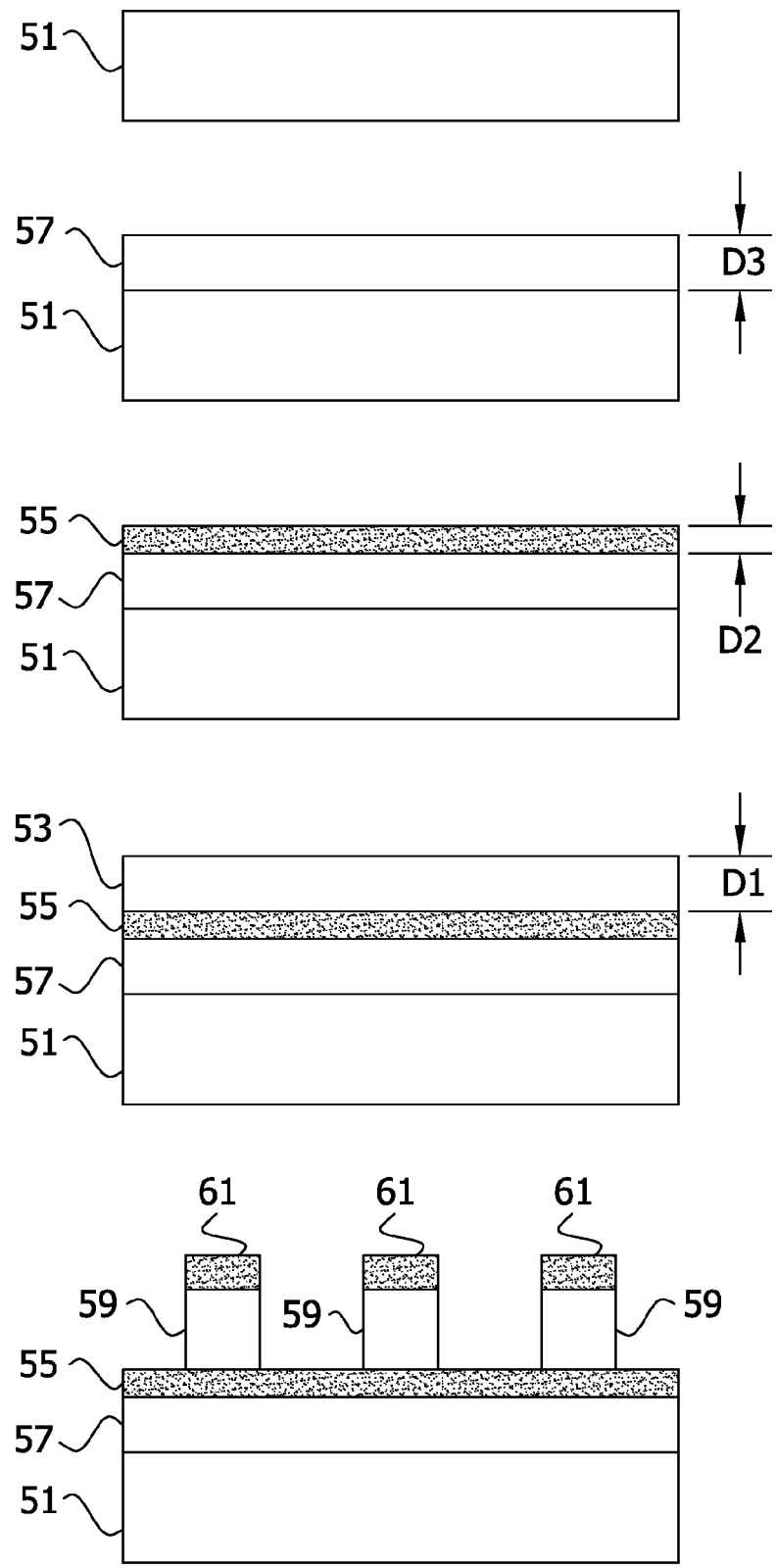
FIG. 4 is a cross-section of a silicon wafer substrate upon which an epitaxial layer of the invention is deposited.

With reference now to FIG. 4, a cross-section of a silicon wafer substrate 51 is shown on which an epitaxial layer is deposited, the epitaxial layer comprising three distinct regions (1) a surface epitaxial region 53 extending an average transverse distance, $D_1$, as measured from the front surface of the epitaxial layer toward the central plane of the silicon substrate; (2) an endpoint detection epitaxial region 55 extending an average transverse distance, $D_2$, as measured from the surface epitaxial region toward the central plane of the silicon substrate; and (3) a bulk epitaxial region 57 extending an average transverse distance, $D_3$, as measured from the endpoint detection epitaxial region toward the central plane of the silicon substrate.

The bulk epitaxial region 57 generally comprises the thickest part of epitaxial layer since fin heights for three dimensional transistor manufacture are thin compared to the overall thickness of the epitaxial layer. The average transverse distance, $D_3$, of the bulk epitaxial region 57 as measured from the endpoint detection epitaxial region toward the central plane of the silicon substrate typically varies depending upon the intended use of the wafer and the specifications of the device manufacture. These considerations will, in turn, dictate the total thickness of the epitaxial layer, the total thickness of the endpoint detection epitaxial region, and the total thickness of the surface epitaxial region, described in more detail below. In general, the average transverse distance of the bulk epitaxial region covers all but the top about 100 nm to about 300 nm portion of the epitaxial layer, such that, if the epitaxial layer were, for example, about 2 micrometers thick, the average transverse distance of the bulk epitaxial region may therefore may range from about 1.7 micrometers to about 1.9 micrometers.

Epitaxial process conditions are typically controlled to deposit a bulk epitaxial region comprising a very low endpoint detection impurity concentration. "Endpoint detection impurity" is understood herein to comprise non-electrically active dopant atoms that are added to mark the endpoint of plasma etching during fin manufacture, such as carbon and germanium. "Endpoint detection impurity" as used herein does not extend to electrically active dopant atoms commonly used to alter the electrical characteristics of the epitaxial layer, such as As, P, and B. Epitaxial deposition conditions are preferably selected to yield a bulk epitaxial region having less endpoint detection impurity than its detectable limit, which is currently about $1\times10^{16}$ atoms/cm$^3$ (about 0.2 PPMA) as measured by secondary ion mass spectrometry (SIMS). Current experimental procedures may be used to limit the endpoint detection impurity concentration in the bulk epitaxial region to less than about $5\times10^{-6}$ atoms/cm$^3$ (about 1 PPMA), preferably less than about $1\times10^{16}$ atoms/cm$^3$ (about 0.2 PPMA), preferably less than about $5\times10^{15}$ atoms/cm$^3$ (about 0.1 PPMA), even more preferably less than about $1\times10^{15}$ atoms/cm$^3$ (about 0.02 PPMA), less than about $1\times10^{14}$ atoms/cm$^3$, less than about $1\times10^{13}$ atoms/cm$^3$, or even less than about $1\times10^{12}$ atoms/cm$^3$.

The bulk epitaxial region may comprise electrically active N-type or P-type dopants. Typical N-type dopants include phosphorous, arsenic, and antimony. Typical P-type dopants include boron, aluminum, and gallium. In one preferred embodiment, the bulk epitaxial region is doped with p-type dopant, and more preferably, the bulk epitaxial region is doped with boron. Dopant concentrations may vary between about $1\times10^{14}$ dopant atoms per cm$^3$ (about 0.002 PPMA) to about $2\times10^{16}$ dopant atoms per cm$^3$ (about 0.4 PPMA), which corresponds to resistivities between about 131 ohm cm and about 0.77 ohm cm. Preferably, the concentrations of the dopant atoms in the bulk epitaxial region are between about $1\times10^{15}$ dopant atoms per cm$^3$ (about 0.02 PPMA) and about $10^{16}$ dopant atoms per cm$^3$ (about 0.2 PPMA), which corresponds to resistivities between about 13 ohm cm and about 1.4 ohm cm. Preferably, the epitaxial deposition conditions are such that the entire epitaxial region, i.e., the bulk region, the endpoint detection region, and the surface region are doped with the same electrically active dopant at substantially the same concentrations, such that the entire epitaxial region is substantially homogenous throughout with respect to its electrical properties.

After deposition of the bulk epitaxial region, the epitaxial deposition process conditions (e.g., gas mix, temperature) may be varied in order to deposit endpoint detection impurity atoms into the growing epitaxial layer, thereby causing an abrupt transition in the epitaxial layer composition. Since the change in the composition of gas mix during epitaxial deposition is not instantaneous, there may be a narrow transitional region between the bulk epitaxial region and the endpoint detection epitaxial region characterized by a steep gradient of increasing endpoint detection impurity concentrations from the low concentration in the bulk epitaxial region to the desired endpoint detection impurity concentration in the endpoint detection epitaxial region.

With reference again to FIG. 4, the endpoint detection region 55 extends an average transverse distance, $D_2$, as measured from the surface epitaxial region 53 toward the central plane of from about 5 nm to about 100 nm, such as from about 10 nm to about 50 nm, or even from about 10 nm to about 25 nm. In some embodiments, the thickness of the endpoint detection region may range from about 8 nm to about 12 nm, such as about 10 nm.

The endpoint detection epitaxial region comprises an endpoint detection impurity present in a substantially higher concentration than in the surface epitaxial region. Preferably, the endpoint detection impurity is also present in the endpoint detection epitaxial region at a concentration significantly higher than in both the surface epitaxial region and in the bulk epitaxial region. The endpoint detection impurity as that term is used herein is a non-electrically active dopant atom such that the endpoint detection impurity does not affect the electrical properties, such as resistivity, of the final semiconductor substrate. Accordingly, the endpoint detection impurity does not encompass electrically active dopant atoms, e.g., boron, phosphorus, or arsenic. The endpoint detection impurity is also selected such that it can be consumed and removed easily during subsequent three dimensional transistor processing steps, such as during silicon oxidation succeeding fin etching. Exemplary impurities meeting these requirements include carbon, germanium, or even a combination of carbon and germanium. In a preferred embodiment, the endpoint detection impurity is present within the endpoint detection epitaxial region at a substantially higher concentration than in the surface epitaxial region is carbon.

Generally, the endpoint detection impurity in the endpoint detection epitaxial region is present at a concentration that is at least 100 times a concentration of the endpoint detection impurity in the surface epitaxial region, preferably, the concentration of the endpoint detection impurity in the endpoint detection epitaxial region is at least 1000 times the concentration of the endpoint detection impurity in the surface epitaxial region, such as at least 10,000 times the concentration of the endpoint detection impurity in the surface epitaxial region. In terms of absolute impurity concentration, the endpoint detection impurity may be present in the endpoint detection epitaxial region at a concentration from about $1\times10^{17}$ atoms/cm$^3$ (about 2 PPM) to about $5\times10^{11}$ atoms/cm$^3$ (about 1000 PPMA), such as between about $5\times10^{17}$ atoms/cm$^3$ (about 10 PPM) to about $5\times10^{19}$ atoms/cm$^3$ (about 1000 PPMA).

The endpoint detection epitaxial region may further comprise, in addition to the above-described endpoint detection impurity, electrically active N-type or P-type dopants. Typical N-type dopants include phosphorous, arsenic, and antimony. Typical P-type dopants include boron, aluminum, and gallium. In one preferred embodiment, the endpoint detection epitaxial region is doped with p-type dopant, more preferably, the endpoint detection epitaxial region is doped with boron. Dopant concentrations may vary between about $1\times10^{14}$ dopant atoms per cm$^3$ (about 0.002 PPMA) to about $2\times10^{16}$ dopant atoms per cm$^3$ (about 0.4 PPMA), which corresponds to resistivities between about 131 ohm cm and about 0.77 ohm cm. Preferably, the concentration of the dopant atoms in the endpoint detection epitaxial region are between about $1\times10^{15}$ dopant atoms per cm$^3$ (about 0.02 PPMA) and about $10^{16}$ dopant atoms per cm$^3$ (about 0.2 PPMA), which corresponds to resistivities between about 13 ohm cm and about 1.4 ohm cm.

After deposition of the endpoint detection epitaxial region, the epitaxial deposition process conditions (e.g., gas mix, temperature) may again be varied in order to reduce the concentration of endpoint detection impurity atoms into the growing epitaxial layer and grow a functional surface epitaxial region in which fins will be formed. Since the change in the composition of gas mix during epitaxial deposition is not instantaneous, there may be a narrow transitional region between the endpoint detection epitaxial region and the surface epitaxial region characterized by a steep gradient of decreasing endpoint detection dopant concentrations from the desired impurity concentration in the endpoint detection epitaxial region to a low impurity concentration in the surface epitaxial region.

With reference again to FIG. 4, the surface epitaxial region 53 extends an average transverse distance, $D_1$, as measured from the front surface of the epitaxial layer toward the central plane of the silicon substrate from about 50 nanometers to about 400 nanometers, from about 100 nanometers to about 400 nanometers, from about 100 nanometers to about 300 nanometers, or from about 200 nm to about 300 nm. Since the fins useful for the manufacture of three dimensional transistors are prepared by etching the surface epitaxial region, it is preferable to carefully control the deposition of the surface epitaxial region in order to minimize the total thickness variation of the surface epitaxial region. The total thickness variation of the surface epitaxial region may be calculated by the equation:

$$TTV(\text{in \%}) = [(\text{Maximum}_{td} - \text{Minimum}_{td})/\text{std dev}] \times 100$$

wherein TTV (in %) is the total thickness variation in %, Maximum$_{td}$ is the maximum transverse distance of the surface epitaxial region, Minimum$_{td}$ is the minimum transverse distance of the surface epitaxial region, and std dev is the standard deviation. The total thickness variation is generally between about 0.5% and about 4%, but is preferably between about 1% and about 2%.

As stated above, the endpoint detection impurity concentration in the endpoint detection epitaxial region is preferably at least 100×, at least 1000×, or even at least 10,000× the impurity concentration in the surface epitaxial region. Epitaxial deposition conditions are preferably selected to yield a surface epitaxial region having less endpoint detection impurity than its detectable limit, which is currently about $1 \times 10^{16}$ atoms/cm$^3$ (about 0.2 PPMA) as measured by secondary ion mass spectrometry (SIMS). Current experimental procedures may be used to limit the endpoint detection impurity concentration in the surface epitaxial region to less than about $5 \times 10^{16}$ atoms/cm$^3$ (about 1 PPMA), preferably less than about $1 \times 10^{16}$ atoms/cm$^3$ (about 0.2 PPMA), preferably less than about $5 \times 10^{15}$ atoms/cm$^3$ (about 0.1 PPMA), even more preferably less than about $1 \times 10^{15}$ atoms/cm$^3$ (about 0.02 PPMA), less than about $1 \times 10^{14}$ atoms/cm$^3$, less than about $1 \times 10^{13}$ atoms/cm$^3$, or even less than about $1 \times 10^{12}$ atoms/cm$^3$.

The surface epitaxial region may further comprise electrically active N-type or P-type dopants. Typical N-type dopants include phosphorus, arsenic, and antimony. Typical P-type dopants include boron, aluminum, and gallium. In one preferred embodiment, the surface epitaxial region is doped with p-type dopant, more preferably, the surface epitaxial region is doped with boron. Dopant concentrations may vary between about $1 \times 10^{14}$ dopant atoms per cm$^3$ (about 0.002 PPMA) to about $2 \times 10^{16}$ dopant atoms per cm$^3$ (about 0.4 PPMA), which corresponds to resistivities between about 131 ohm cm and about 0.77 ohm cm. Preferably, the surface epitaxial region is doped a concentrations between about $1 \times 10^{15}$ dopant atoms per cm$^3$ (about 0.02 PPMA) to about $10^{16}$ dopant atoms per cm$^3$ (about 0.2 PPMA), which corresponds to resistivities between about 13 ohm cm and about 1.4 ohm cm.

C. Epitaxial Deposition

The present invention is further directed to a method for preparing a semiconductor structure comprising (a) a silicon substrate having a central axis, a front surface and a back surface that are generally perpendicular to the central axis, a central plane between and parallel to the front and back surfaces, a circumferential edge, and a radius extending from the central axis to the circumferential edge and (b) an epitaxial layer having a front surface and a back surface, wherein the back surface of the epitaxial layer is contiguous with the front surface of the silicon substrate. The process comprises forming the above-described bulk epitaxial region on the front surface of the silicon substrate, which is followed by forming the endpoint detection epitaxial region on the bulk epitaxial region, and finally forming the surface epitaxial region on the endpoint detection epitaxial region. The endpoint detection epitaxial region comprises the endpoint detection impurity selected from the group consisting of carbon, germanium, or a combination thereof present in the endpoint detection epitaxial region at a concentration that is at least 100 times a concentration of the endpoint detection impurity in the surface epitaxial region.

The epitaxial layer may be deposited onto the entire wafer, or, alternatively, onto only a portion of the wafer, e.g., just the front surface of the wafer or just the back surface of the wafer. For example, in one embodiment, the back surfaces of two wafers may be pressed together during epitaxial deposition to deposit epitaxial layers on only the front surfaces of the two wafers. Referring to FIG. 3, the epitaxial layer 45 preferably is deposited onto the front surface 35 of the wafer. More preferably, it is deposited onto the entire front surface 35 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

In a typical process, the surface of the silicon substrate may be cleaned of surface oxides by, for example, heating the surface of the wafer in an oxidant-free atmosphere, such as to a temperature of at least about 1100° C. in an atmosphere comprising H$_2$ or a noble gas (e.g., He, Ne, or Ar). Alternatively, surface oxides may be chemically stripped by means known in the art using phosphoric acid, hydrofluoric acid, or other acids as are known.

Epitaxial deposition is carried out by chemical vapor deposition. Chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., SiCl$_4$, SiHCl$_3$, SiH$_2$Cl$_2$, SiH$_3$Cl, or SiH$_4$). The atmosphere also preferably contains a carrier gas (preferably H$_2$). For example, the source of silicon during the epitaxial deposition may be SiH$_2$Cl$_2$ or SiH$_4$. If SiH$_2$Cl$_2$ is used, the reactor vacuum pressure during deposition preferably is from about 500 to about 760 Torr. If, on the other hand, SiH$_4$ is used, the reactor pressure preferably is about 100 Torr. Most preferably, the source of silicon during the deposition is SiHCl$_3$. This tends to be much cheaper than other sources. In addition, an epitaxial deposition using SiHCl$_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising the silicon-containing gas from depositing polycrystalline silicon on the surface. Generally, the temperature of the surface during this period preferably is at least about 900° C. More preferably, the temperature of the surface is maintained in the range of between about 1050° C. and about 1150° C. Most preferably, the temperature of the surface is maintained at the silicon oxide removal temperature.

The rate of growth of the epitaxial deposition preferably is from about 0.5 to about 7.0 micrometers/min. A rate of about 3.5 to about 4.0 micrometers/min may be achieved, for example, by using an atmosphere consisting essentially of about 2.5 mole % SiHCl$_3$ and about 97.5 mole % H$_2$ at a temperature of about 1150° C. and an absolute pressure of up to about 1 atm.

In some applications, the wafers comprise an epitaxial layer which imparts electrical properties. For example, in the preparation of an n-type epitaxial layer, the epitaxial layer is lightly doped with phosphorous, arsenic, or antimony. Therefore, the ambient atmosphere for epitaxial deposition further comprises a gaseous source of phosphorous, arsenic, or antimony present as a volatile compound, such as, for example, arsine, $AsH_3$, or phosphine, $PH_3$. Alternatively, the epitaxial layer can contain boron. Such a layer may be prepared by, for example, including $B_2H_6$ in the atmosphere during the deposition.

As stated above, the epitaxial layer comprises an endpoint detection epitaxial region comprising an endpoint detection impurity selected from among germanium, carbon, or even a combination of germanium and carbon. In either case, the composition of the epitaxial deposition gas mix (i.e., both the introduction of the endpoint detection impurity-containing gas and the elimination of the gas from the deposition gas mix) can be changed rapidly in order to precisely control the thickness and location of the endpoint detection layer.

To incorporate germanium impurity into the epitaxial layer, a volatile source of germanium is included into the epitaxial deposition gas mix. Volatile germanium sources include germane, germanium dichloride, germanium tetrachloride, among others. To incorporate carbon impurity into the epitaxial layer, a volatile source of carbon is included into the epitaxial deposition gas mix. Volatile carbon sources include methane, ethane, methyl chloride, methylene chloride, chloroform, carbon tetrachloride, among others.

After the endpoint detection epitaxial region is deposited to the desired thickness, the epitaxial gas deposition mix is varied to eliminate the sources of germanium or carbon. Additional process conditions, e.g., temperature, are preferably further varied to reduce the epitaxial growth rate, since it is desirable to control the growth of the surface epitaxial region to precise thicknesses, such that the surface epitaxial region can be precisely etched to yield fins having uniform fin heights.

Epitaxial deposition typically requires a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. The epitaxial wafers of the present invention may be cleaned by methods known in the art.

D. Plasma Etching

After deposition of the epitaxial layer comprising the bulk region, the endpoint detection region, and the surface epitaxial region, the semiconductor structure is plasma etched to define, within the surface epitaxial region, the desired pattern of fin(s) for use in the manufacture of three dimensional transistors.

With reference to FIG. 4, the fins 59 comprise cuboids of silicon that extend from the surface of the semiconductor structure, the cuboids being defined by a length, a depth, and a height. The length and the depth dimensions of the fin are perpendicular to the fin height and are determined by the pattern of a hard mask 61, such as SiN, that is resistant to plasma etching.

The length and width of the fins may depend on the intended use of the wafer. Herein, the "length" of the fin refers to that transverse dimension that is perpendicular to the fin height and the fin depth and is conventionally longer than the depth. Likewise, the "depth" of the fin refers to the dimension that transverse dimension that is perpendicular to the fin height and the fin length and is conventionally shorter than the length. The length and depth dimensions of the fin are dictated by the intended use of the wafer and the specifications of the device manufacturer.

Plasma etching etches portions of the surface epitaxial region to reveal the fin pattern and to define the fin height. The endpoint of plasma etching is marked by a change in the gas mix within the plasma etching chamber as the surface epitaxial region is etched away and the endpoint detection epitaxial region is revealed. The gas mix in the plasma etch chamber is continuously monitored to determine the composition of the epitaxial layer that is removed from the semiconductor substrate. Since the variation in refractive index of the gas mix resulting from the surface epitaxial region to the endpoint plasma etching may be slight if the refractive index varies at all, laser interferometry may not be a particularly useful method for detection of the endpoint of plasma etching. In such instances, therefore, optical emission spectrometry ("OES") is preferred. OES monitors the intensity of several wavelengths in the chamber and determines when the intensity of specific wavelengths increases or decreases below some criteria level. In other instances, mass spectroscopy may also be applied to detect gas phase species in the plasma discharge. See, for example, Silicon Processing for the VLSI era Volume 1, S. Wolf and R. N. Tauber.

When the surface epitaxial region is etched, the gas mix typically comprises silicon and electrically active dopant, if present. Since the surface epitaxial region may contain low concentrations of the endpoint detection impurity, the instrument detects a baseline concentration of endpoint detection impurity in the plasma etching chamber. As the surface epitaxial region is etched away, the endpoint detection epitaxial region is revealed, and the concentration of the endpoint detection impurity increases over the baseline amount measured during etching of the surface epitaxial region. The signal to endpoint of plasma etching is therefore at least some concentration increase that may be differentiated from the noise, e.g., standard deviation of the baseline, for example, when the impurity concentration increases by at least about 5%, at least about 10%, at least about 15%, or even at least about 20%, with the concentration increase to measure the endpoint of plasma detection determined empirically and at least in part due to the standard deviation of the baseline. With reference again to FIG. 4, at this point, the semiconductor substrate comprises the silicon wafer substrate, the bulk epitaxial region, a slightly etched endpoint detection region, and discrete fins topped by SiN hard mask.

In this manner, fin(s) are produced from the surface epitaxial region that extend a height as measured from the front surface of the epitaxial layer toward the central plane from about 100 nm to about 400 nm, from about 100 nm to about 300 nm, or from about 200 nm to about 300 nm.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and method without departing from the scope of the invention, it is intended that all matter contained in the above description and shown in the accompanying drawings shall be interpreted as illustrative and not in a limiting sense.

What is claimed is:
1. A semiconductor structure comprising:
(a) a silicon substrate having a central axis, a front surface and a back surface that are generally perpendicular to the central axis, a central plane between and parallel to the front and back surfaces, a circumferential edge, and a radius extending from the central axis to the circumferential edge;

(b) an epitaxial layer having a front surface and a back surface, wherein the back surface of the epitaxial layer is contiguous with the front surface of the silicon substrate, the epitaxial layer comprising:

(1) a surface epitaxial region extending an average transverse distance, $D_1$, as measured from the front surface of the epitaxial layer toward the central plane;

(2) an endpoint detection epitaxial region extending an average transverse distance, $D_2$, as measured from the surface epitaxial region toward the central plane; and (3) a bulk epitaxial region extending an average transverse distance, $D_3$, as measured from the endpoint detection epitaxial region toward the central plane;

wherein the endpoint detection epitaxial region comprises an endpoint detection impurity selected from the group consisting of carbon, germanium, or a combination thereof present in the endpoint detection epitaxial region at a concentration from about $1\times10^{17}$ atoms/cm$^3$ (about 2 PPM) to about $5\times10^{19}$ atoms/cm$^3$ (about 1000 PPMA), the concentration being at least 100 times a concentration of the endpoint detection impurity in the surface epitaxial region.

2. The semiconductor structure of claim 1 wherein the concentration of the endpoint detection impurity in the endpoint detection epitaxial region is at least 1000 times the concentration of the endpoint detection impurity in the surface epitaxial region.

3. The semiconductor structure of claim 1 wherein the concentration of the endpoint detection impurity in the endpoint detection epitaxial region is at least 10,000 times the concentration of the endpoint detection impurity in the surface epitaxial region.

4. The semiconductor structure of claim 1 wherein $D_1$ is from about 50 nanometers to about 400 nanometers.

5. The semiconductor structure of claim 4 wherein $D_1$ has a total thickness variation between about 0.5% and about 4%.

6. The semiconductor structure of claim 1 wherein the surface epitaxial region comprises a fin.

7. The semiconductor structure of claim 6 wherein the fin extends a height as measured from the front surface of the epitaxial layer toward the central plane from about 50 nanometers to about 400 nanometers.

8. The semiconductor structure of claim 1 wherein $D_2$ is from about 5 nm to about 100 nm.

* * * * *